(12) United States Patent
Liu

(10) Patent No.: US 12,512,334 B2
(45) Date of Patent: Dec. 30, 2025

(54) SEMICONDUCTOR REACTION CHAMBER AND SEMICONDUCTOR PROCESSING APPARATUS

(71) Applicant: BEIJING NAURA MICROELECTRONICS EQUIPMENT CO., LTD., Beijing (CN)

(72) Inventor: Jian Liu, Beijing (CN)

(73) Assignee: BEIJING NAURA MICROELECTRONICS EQUIPMENT CO., LTD., Beijing (CN)

( * ) Notice: Subject to any disclaimer, the term of this patent is extended or adjusted under 35 U.S.C. 154(b) by 0 days.

(21) Appl. No.: 18/174,318

(22) Filed: Feb. 24, 2023

(65) Prior Publication Data

US 2023/0223280 A1 Jul. 13, 2023

Related U.S. Application Data

(63) Continuation of application No. PCT/CN2021/112501, filed on Aug. 13, 2021.

(30) Foreign Application Priority Data

Aug. 25, 2020 (CN) .......................... 202010862511.X

(51) Int. Cl.
*H01L 21/67* (2006.01)
*H01L 21/683* (2006.01)

(52) U.S. Cl.
CPC .... *H01L 21/67069* (2013.01); *H01L 21/6833* (2013.01)

(58) Field of Classification Search
CPC .................. H01L 21/67069; H01L 21/6833
See application file for complete search history.

(56) References Cited

U.S. PATENT DOCUMENTS 5,462,603 A * 10/1995 Murakami .............. C23C 16/46
118/724
7,724,493 B2 5/2010 Mizuno et al.
(Continued)

FOREIGN PATENT DOCUMENTS

CN 101197249 A 6/2008
CN 101719480 A 6/2010
(Continued)

OTHER PUBLICATIONS

The World Intellectual Property Organization (WIPO) International Search Report for PCT/CN2021/112501 Oct. 28, 2021 7 Pages (including translation).

*Primary Examiner* — Parviz Hassanzadeh
*Assistant Examiner* — Margaret Klunk
(74) *Attorney, Agent, or Firm* — ANOVA LAW GROUP, PLLC

(57) ABSTRACT

Embodiments of the present disclosure provide a semiconductor reaction chamber, including a chamber body, an electrostatic chuck, a functional wire, and a pressure adjustment device. The chamber body includes an inner chamber. The electrostatic chuck is located in the inner chamber and includes a base body and a functional layer. The base body includes a connection wire channel. The functional layer is arranged on the base body. The base body and the functional layer are fixed by bonding. The functional layer covers an end opening of the connection wire channel and forms an accommodation chamber with the base body. The functional wire passes through the connection wire channel and is in contact with the functional layer. The pressure adjustment device communicates with the accommodation chamber and is configured to balance a pressure in the accommodation chamber and a pressure in the inner chamber.

18 Claims, 4 Drawing Sheets

(56) References Cited

U.S. PATENT DOCUMENTS

| | | | |
|---|---|---|---|
| 2001/0054385 A1* | 12/2001 | Horiguchi | C23C 16/4586 118/723 R |
| 2003/0033116 A1 | 2/2003 | Brcka et al. | |
| 2004/0144322 A1* | 7/2004 | Kuibira | C23C 16/45521 118/728 |
| 2004/0149227 A1* | 8/2004 | Saito | H01L 21/67115 118/728 |
| 2004/0226515 A1 | 11/2004 | Yendler et al. | |
| 2005/0022744 A1* | 2/2005 | Natsuhara | C23C 16/4586 118/728 |
| 2005/0213951 A1* | 9/2005 | Odagaki | H01L 21/67115 392/411 |
| 2006/0160359 A1* | 7/2006 | Kasai | C23C 16/45521 118/715 |
| 2015/0132969 A1 | 5/2015 | Koiwa | |
| 2015/0287618 A1 | 10/2015 | Matsumoto et al. | |
| 2017/0144313 A1 | 5/2017 | Sakai et al. | |
| 2017/0294333 A1* | 10/2017 | Iu | H01L 21/67288 |
| 2018/0024573 A1* | 1/2018 | Mohammed | G01F 25/15 702/100 |
| 2018/0294177 A1 | 10/2018 | Peng et al. | |
| 2019/0267219 A1* | 8/2019 | Uemura | H01J 37/32834 |
| 2020/0294837 A1* | 9/2020 | Zeng | H05K 1/0284 |

FOREIGN PATENT DOCUMENTS

| | | | | |
|---|---|---|---|---|
| CN | 102810447 A | | 12/2012 | |
| CN | 103811393 B | | 12/2016 | |
| CN | 106601656 A | | 4/2017 | |
| CN | 106783715 A | | 5/2017 | |
| CN | 209658147 U | | 11/2019 | |
| CN | 111968901 A | | 11/2020 | |
| JP | H0778766 A | * | 3/1995 | H01L 21/67115 |
| JP | 2003253449 A | | 9/2003 | |
| JP | 2003258068 A | | 9/2003 | |
| JP | 2004263209 A | | 9/2004 | |
| JP | 2005311270 A | | 11/2005 | |
| JP | 2007002298 A | * | 1/2007 | H01L 21/67098 |
| JP | 2011054838 A | * | 3/2011 | H01L 21/67017 |
| JP | 2015517224 A | | 6/2015 | |
| TW | 201926544 A | | 7/2019 | |
| WO | WO-2010110044 A1 | * | 9/2010 | H01L 21/6831 |
| WO | 2020067357 A1 | | 4/2020 | |

* cited by examiner

SEMICONDUCTOR REACTION CHAMBER AND SEMICONDUCTOR PROCESSING APPARATUS

CROSS-REFERENCES TO RELATED APPLICATIONS

The present disclosure is a continuation of International Application No. PCT/CN2021/112501, filed on Aug. 13, 2021, which claims priority to Chinese Application No. 202010862511.X filed on Aug. 25, 2020, the entire content of all of which are incorporated herein by reference.

TECHNICAL FIELD

The present disclosure generally relates to the semiconductor apparatus technology field and, more particularly, to a semiconductor reaction chamber and a semiconductor processing apparatus.

BACKGROUND

A semiconductor processing apparatus including an electrostatic chuck is widely used in a preparation process of an integrated circuit such as plasma etching, physical vapor deposition, chemical vapor deposition, etc. The electrostatic chuck is arranged in a semiconductor reaction chamber of the semiconductor processing apparatus. The electrostatic chuck is configured to fix and support a wafer. Meanwhile, the electrostatic chuck also provides a DC bias voltage for the wafer and controls the temperature of the wafer.

Usually, the electrostatic chuck includes a base body and a functional layer. The functional layer is generally fixed at the base body through an adhesive layer. The base body is provided with a plurality of wiring channels for a functional wire to pass through. Thus, the functional wire can be in contact with the functional layer. The functional wire includes, for example, a detection wire, a control wire, etc. A temperature detection device is configured to detect the temperature of the wafer carried on the electrostatic chuck through the detection wiring. A controller is configured to control a heater in the functional layer through the control wiring to control the temperature of the wafer on the electrostatic chuck.

However, in a specific working process, an internal member of the semiconductor reaction chamber in the semiconductor processing apparatus is usually in a vacuum state, while the above wiring channel in the base body is in an atmospheric pressure state. A pressure difference between the internal member of the chamber and the wiring channel causes a force to act on a plurality of members of the electrostatic chuck. Thus, the adhesion between the base body and the functional layer is easily damaged, thereby affecting the installation effect of the electrostatic chuck.

SUMMARY

The present disclosure provides a semiconductor reaction chamber and a semiconductor processing apparatus to solve the problem of low connection reliability of parts of the electrostatic chuck due to unbalanced pressure in the semiconductor reaction chamber and the accommodation chamber of the electrostatic chamber.

Embodiments of the present disclosure provide a semiconductor reaction chamber, including a chamber body, an electrostatic chuck, a functional wire, and a pressure adjustment device. The chamber body includes an inner chamber. The electrostatic chuck is located in the inner chamber and includes a base body and a functional layer. The base body includes a connection wire channel. The functional layer is arranged on the base body. The base body and the functional layer are fixed by bonding. The functional layer covers an end opening of the connection wire channel and forms an accommodation chamber with the base body. The functional wire passes through the connection wire channel and is in contact with the functional layer. The pressure adjustment device communicates with the accommodation chamber and is configured to balance a pressure in the accommodation chamber and a pressure in the inner chamber.

Embodiments of the present disclosure provide a semiconductor processing apparatus, including a semiconductor reaction chamber. The semiconductor reaction chamber includes a chamber body, an electrostatic chuck, a functional wire, and a pressure adjustment device. The chamber body includes an inner chamber. The electrostatic chuck is located in the inner chamber and includes a base body and a functional layer. The base body includes a connection wire channel. The functional layer is arranged on the base body. The base body and the functional layer are fixed by bonding. The functional layer covers an end opening of the connection wire channel and forms an accommodation chamber with the base body. The functional wire passes through the connection wire channel and is in contact with the functional layer. The pressure adjustment device communicates with the accommodation chamber and is configured to balance a pressure in the accommodation chamber and a pressure in the inner chamber.

The technical solution adopted in the present disclosure can achieve the following beneficial effects.

In the technical solutions, embodiments of the present disclosure provide the semiconductor reaction chamber and the semiconductor processing apparatus. With the pressure adjustment device communicating with the accommodation chamber, the pressure in the accommodation chamber and the pressure in the inner chamber can be balanced to cause the pressure of the accommodation chamber to be equal to the pressure of the inner chamber. Thus, the damage of the bounding between the base body and the functional layer due to the pressure difference between the inner chamber and the accommodation chamber can be avoided. Thus, the connection stability between the base body and the functional layer can be improved, and the service life of the electrostatic chuck can be improved.

BRIEF DESCRIPTION OF THE DRAWINGS

The accompanying drawings described here are provided to further understand the present disclosure and form a part of the present disclosure. Exemplary embodiments of the present disclosure and description of the exemplary embodiments of the present disclosure are used to describe the present disclosure and do not limit the present disclosure.

REFERENCE NUMERALS

| | | |
|---|---|---|
| 100 - Chamber body | 110 - Inner chamber | 120 - Nozzle |
| 200 - Electrostatic chuck | 210 - Base body | 211 - Connection wire channel |
| 220 - Ceramic layer | 230 - Heating layer | 231 - Second via |
| 300 - Functional wire | | |
| 400 - Air extraction device | 410 - Air extraction mechanism | 420 - First pipeline |
| 421 - First switch valve | 430 - Pressure detection device | 450 - Connection pipeline |
| 500 - Air inflation device | 510 - Air inflation mechanism | 520 - Second pipeline |
| 521 - Second switch valve | | |
| 600 - Mounting member | 610 - Mounting hole | 630 - Annular groove |
| 700 - Connection flange | 710 - Air channel | 720 - Body member |
| 730 - Connection member | 731 - First via | 740 - Wire hole |
| 810 - First apparatus | 820 - Second apparatus | |
| 900 - Electrode shell body | | |

DETAILED DESCRIPTION OF THE EMBODIMENTS

In order to make the objectives, technical solutions, and advantages of the present disclosure clearer, the technical solutions of the present disclosure are described in detail below with reference to specific embodiments of the present disclosure and corresponding drawings. Apparently, described embodiments are only some embodiments of the present disclosure, but not all embodiments of the present disclosure. Based on embodiments of the present disclosure, all other embodiments obtained by those of ordinary skill in the art without creative efforts shall be within the scope of the present disclosure.

The technical solutions of embodiments of the present disclosure are described in detail below with reference to the accompanying drawings.

As shown in FIGS. 1 to 5, embodiments of the present disclosure provide a semiconductor reaction chamber. The semiconductor reaction chamber is applied to a semiconductor processing apparatus. The semiconductor reaction chamber includes a chamber body 100, an electrostatic chuck 200, a functional wire 300, and a pressure adjustment device.

Figure 1:
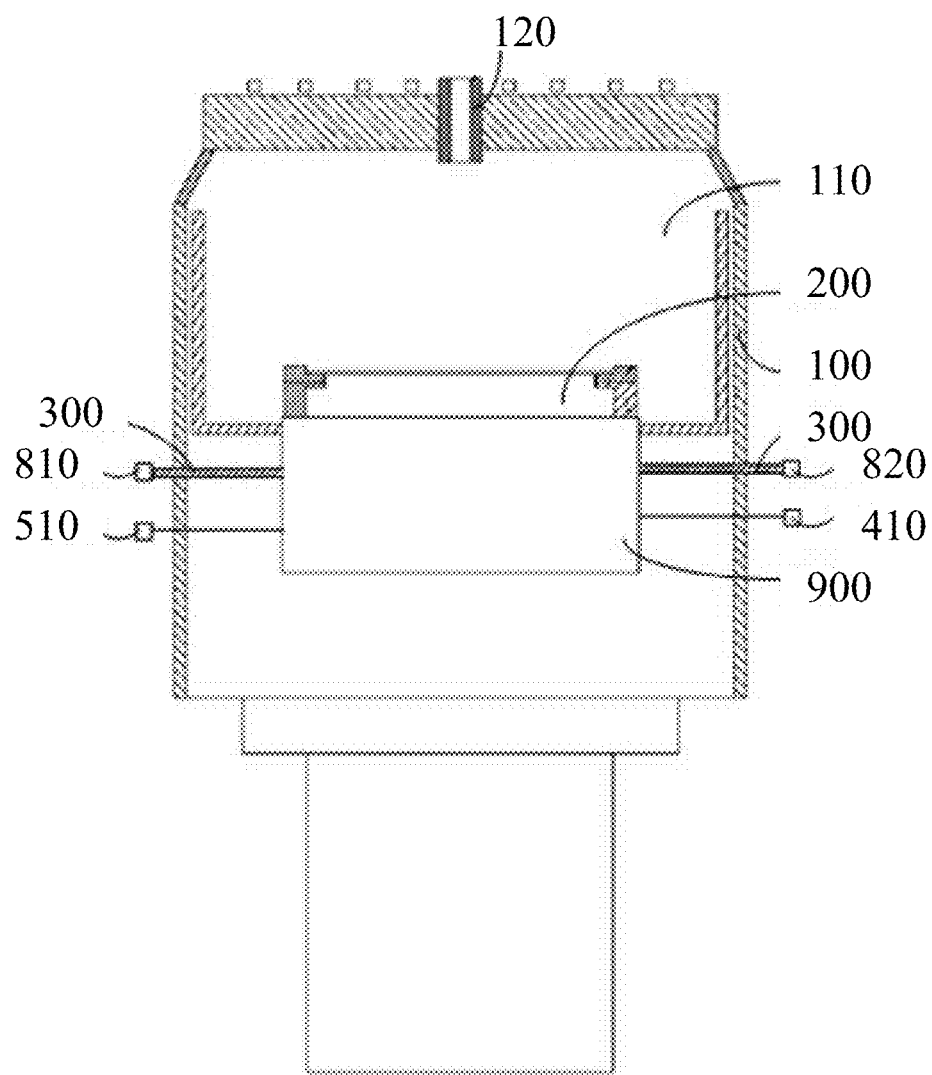
FIG. 1 illustrates a schematic cross-sectional diagram of a semiconductor reaction chamber according to some embodiments of the present disclosure.

The chamber body 100 encloses to form an inner chamber 110. A wafer can be processed in the inner chamber 110. In some embodiments, as shown in FIG. 1, a top of the chamber body 100 includes a nozzle 120 that communicates with the inner chamber 110. Process gas can be introduced into the inner chamber 110 through the nozzle 120. The process gas can physically chemically react with the wafer in the inner chamber 110 to complete the processing of the wafer.

As shown in FIG. 1, the electrostatic chuck 200 is located in the inner chamber 110 and is configured to support and fix the wafer. In some embodiments, the electrostatic chuck 200 can be configured to fix the wafer in an electrostatic adsorption manner. In some embodiments, a lower electrode shell body 900 is arranged below the electrostatic chuck 200. The lower electrode shell body 900 can be configured to support the electrostatic chuck 200 and provide an installation base for the functional wire 300 and other members.

Figure 2:
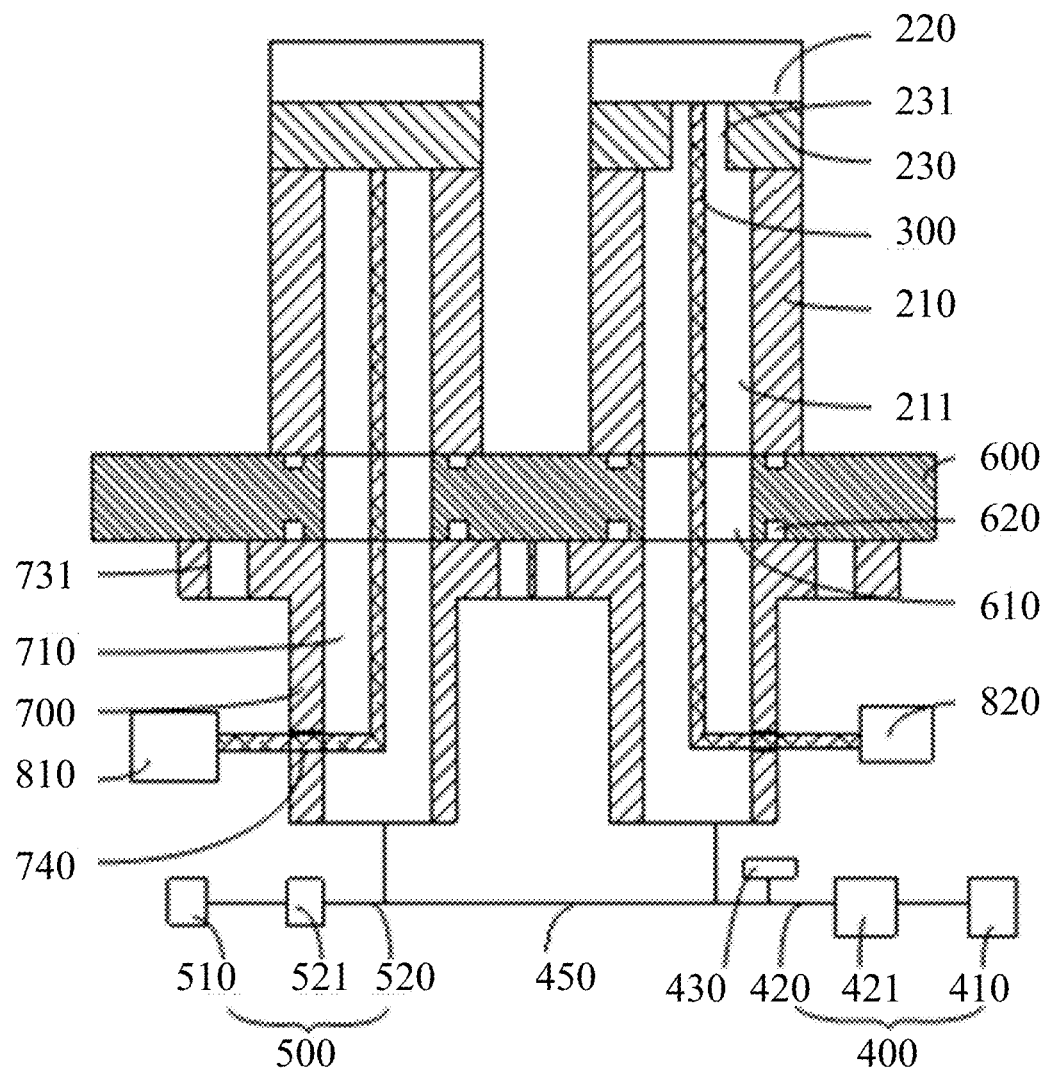
FIG. 2 illustrates a schematic local cross-sectional diagram of a semiconductor reaction chamber according to some embodiments of the present disclosure.

As shown in FIG. 2, the electrostatic chuck 200 includes a base body 210 and a functional layer arranged on the base body 210. The base body 210 can be configured to provide a mounting position for the functional layer. In some embodiments, the base body 210 and the functional layer can be fixed by adhesion. For example, the base body 210 and the functional layer can be bonded by an adhesive such as super glue or hot melt adhesive. A connection wire channel 211 is formed in the base body 210. The functional layer can cover the end opening of the connection wire channel 211 and enclose the connection wire channel 211 with the base body 210 to form an accommodation chamber. The functional wire 300 can pass through the connection wire channel 211 and be in contact with a part of the functional layer exposed at the end opening of the connection wire channel 211. In some embodiments, as shown in FIG. 1 and FIG. 2, an end of the functional wire 300 is located outside of the chamber body 100. The end of the functional wire 300 can be connected to an external apparatus such as a controller, a temperature detection device, etc. Another end of the functional wire 300 passes through the connection wire channel 211 and is in contact with the functional layer. Thus, the external apparatus located outside of the chamber body 100 can perform heating and temperature detection on the wafer at the surface of the electrostatic chuck 200 through the functional wire 300. In some embodiments, a plurality of wiring channels 211 can be provided. Thus, different functional wires 300 can pass through different wiring channels 211. Thus, the above operations can be performed simultaneously, and interference can be avoided from each other.

The pressure adjustment device can communicate with the above accommodating chamber and can be configured to balance the pressure in the accommodation chamber and the pressure in the inner chamber. Thus, the pressure in the accommodation chamber can be equal to the pressure in the inner chamber 110. Thus, the adhesion between the base body 210 and the functional layer can be prevented from being damaged due to the pressure difference between the inner chamber 110 and the accommodation chamber. Further, the connection stability between the base body 210 and the functional layer can be improved to improve service life of the electrostatic chuck 200.

In some embodiments, the above pressure adjustment device can include an air extraction device 400 and/or an air inflation device 500. Taking the pressure adjustment device including the air extraction device 400 and the air inflation device 500 as an example, as shown in FIG. 2, the air extraction device 400 communicates with the accommodation chamber. The air extraction device 400 can be configured to vacuum the accommodation chamber. In some embodiments, an air outlet of the air extraction device 400 can be sealed and connected to an opening of the accommodation chamber. Thus, the air extraction device 400 can extract at least a part of the air in the accommodation chamber. Thus, the pressure in the accommodation chamber can be equal to the pressure in the inner chamber 110. During an etching process of the wafer, the inner chamber 110 can be usually in a vacuum state. Thus, the air extraction device 400 can be controlled to start to extract the air in the accommodation chamber. Thus, the accommodation chamber can be also in the vacuum state.

The air inflation device 500 can be in communication with the accommodation chamber. The air inflation device 500 can be configured to inflate the accommodation chamber. In some embodiments, an air outlet of the air inflation device 500 can be sealed and connected to the opening of the accommodation chamber. Thus, when the semiconductor reaction chamber is in a non-working state, the inner chamber 110 can be usually in the atmospheric pressure state. Then, the air inflation device 500 can be controlled to start to inflate the accommodation chamber to cause the accommodation chamber to be also in the atmospheric pressure state. Thus, the pressure in the accommodation chamber can be equal to the pressure of the inner chamber 110.

In the semiconductor reaction chamber of embodiments of the present disclosure, at least a part of the air in the accommodation chamber can be drawn out by the air extraction device 400, or air can be introduced into the accommodation chamber through the air inflation device 500. Thus, the pressure in the accommodation chamber can be equal to the pressure in the inner chamber 110. The adhesion between the base body 210 and the functional layer can be prevented from being damaged due to the pressure difference between the inner chamber 110 and the accommodation chamber. Further, the connection stability between the base body 210 and the functional layer can be improved. The service life of the electrostatic chuck can be improved.

In some embodiments, the pressure in the accommodation chamber can be always equal to the pressure in the inner chamber 110 through the cooperation between the air extraction device 400 and the air inflation device 500. Thus, the force can be prevented from acting on the members in the electrostatic chuck 200 due to the pressure difference between the inner chamber 110 and the accommodation chamber. Thus, the installation stability between members in the electrostatic chuck 200 can be further improved to improve the service life of the electrostatic chuck 200. In practical applications, the air extraction device 400 or the air inflation device 500 can also be provided independently as needed.

Further, when a plurality of wiring channels 211 are provided, one air extraction device 400 can communicate with a plurality of accommodation chambers. Thus, air in the plurality of accommodation chambers can be extracted through the air extraction device 400 to improve the utilization rate of the air extraction device 400. Similarly, one air inflation device 500 can communicate with the plurality of accommodation chambers. Thus, the air inflation device 500 can inflate the plurality of accommodation chambers to improve the utilization rate of the air inflation device 500.

In embodiments of the present disclosure, as shown in FIG. 2, the air extraction device 400 includes an air extraction mechanism 410 and a first pipeline 420. The air extraction mechanism 410 can include a vacuum pump or a fan. The air extraction mechanism 410 can be arranged outside the inner chamber 110. The air extraction mechanism 410 can communicate with the accommodation chamber through the first pipeline 420. Thus, the first pipeline 420 can be configured to communicate the air extraction mechanism 410 with the accommodation chamber. In some embodiments, a first end of the first pipeline 420 can be located outside the inner chamber 110 and connected to an air outlet of the air extraction mechanism 410. A second end of the first pipeline 420 can extend into the inner chamber 110 and communicate with the opening of the accommodation chamber. In order to ensure airtightness, the first end of the first pipeline 420 can be sealed and connected to the air outlet of the air extraction mechanism 410, and the second end of the first pipeline 420 can be sealed and connected to the opening of the accommodation chamber to prevent air leak from affecting an air extraction effect of the air extraction mechanism 410. In some embodiments, a sealant can be provided between the first end of the first pipeline 420 and the air outlet of the air extraction mechanism 410 and between the second end of the first pipeline 420 and the opening of the accommodation chamber to achieve a better sealing effect. Thus, the air extraction mechanism 410 can have a better air extraction effect on the accommodation chamber.

In addition, the first pipeline 420 can also cause the air extraction mechanism 410 to have a better installation flexibility. In some embodiments, through the extension effect of the first pipeline 420, the air extraction mechanism 410 can be mounted at a plurality of positions outside the chamber body 100. In some embodiments, the first pipeline 420 can be a flexible pipe. Thus, the installation flexibility of the air extraction mechanism 410 can be better improved.

Further, a first switch valve 421 can be arranged at the first pipeline 420. In a specific working process, when the first switch valve 421 is on, the air extraction mechanism 410 can extract at least a part of the air in the accommodation chamber through the first pipeline 420. Thus, the pressure in the accommodation chamber can be equal to the pressure in the inner chamber 110. When the first switch valve 421 is off, the pressure in the accommodation chamber can be maintained in the above state. The first switch valve 421 can be easy to operate to easily cause the pressure in the accommodation chamber to be equal to the pressure in the inner chamber 110.

In some embodiments, the first switch valve 421 can be located outside the chamber body 100 for easy control.

In embodiments of the present disclosure, as shown in FIG. 2, the air inflation device 500 includes an air inflation mechanism 510 and a second pipeline 520. The air inflation mechanism 510 can include, for example, a nitrogen gas supply mechanism. The air inflation mechanism 510 can be arranged outside of the inner chamber 110. The air inflation mechanism 510 can communicate with the accommodation chamber through the second pipeline 520. Thus, the second pipeline 520 can be configured to communicate the air inflation mechanism 510 with the accommodation chamber. In some embodiments, a first end of the second pipeline 520 can be located outside the inner chamber 110 and communicated with the air outlet of the air inflation mechanism 510. A second end of the second pipeline 520 can extend into the inner chamber 110 and communicate with the opening of the accommodation chamber. In order to ensure the airtightness, the first end of the second pipeline 520 can be sealed and connected to the air outlet of the air inflation mechanism 510, and the second end of the second pipeline 520 can be sealed and connected to the opening of the accommodation chamber to prevent the air leak from affecting the air inflation effect of the air inflation mechanism 510. In some embodiments, sealants can be provided between the first end of the second pipeline 520 and the air outlet of the air inflation mechanism 510 and between the second end of the second pipeline 520 and the opening of the accommodation chamber. Thus, a better sealing effect can be achieved to cause the air inflation mechanism 510 to have a better air inflation effect on the accommodation chamber.

In addition, the second pipeline 520 can also cause air inflation mechanism 510 to have a good installation flexibility. In some embodiments, through the extension effect of the second pipeline 520, the air inflation mechanism 510 can be mounted at a plurality of positions of the chamber body 100. In some embodiments, the second pipeline 520 can be a flexible pipe, which can further improve the installation flexibility of the air inflation mechanism 510.

Further, a second switch valve 521 can be arranged at the second pipeline 520. In a specific working process, when the second switch valve 521 is on, the air inflation mechanism 510 can inflate the accommodation chamber through the second pipeline 520 to cause the pressure in the accommodation chamber to be equal to the pressure in the inner chamber 110. When the second switch valve 521 is off, the pressure in the accommodation chamber can be maintained in the above state. The second switch value 521 can be easy to operate to easily cause the pressure in the accommodation chamber to be equal to the pressure in the inner chamber 110.

In some embodiments, the second switch valve 521 can be located outside the chamber body 100 for easy control.

The semiconductor reaction chamber of embodiments of the present disclosure further includes a pressure detection device 430. The pressure detection device 430 includes a pressure detection sensor. The pressure detection device 430 can communicate with the accommodation chamber. The pressure detection device 430 can be configured to detect the pressure in the accommodation chamber. In a specific working process, the pressure detection device 430 can display detected data to facilitate a user to control the air extraction mechanism 410 and the air inflation mechanism 510 to work. Thus, the pressure in the accommodation chamber can be equal to the pressure in the inner chamber 110. This method can facilitate the user to operate to easily adjust the pressure in the accommodation chamber to cause the pressure in the accommodation chamber to be equal to the pressure in the inner chamber 110.

The semiconductor reaction chamber of embodiments of the present disclosure can further include a mounting member 600. The mounting member 600 can be arranged in the lower electrode shell body 900. The base body 210 can be arranged at the mounting member 600. The mounting member 600 can facilitate the installation of the electrostatic chuck 200. Meanwhile, the mounting member 600 can include a mounting hole 610 communicating with the accommodation chamber.

The mounting hole 610 can be sealed and connected to the opening of the accommodation chamber. The air extraction device 400 can communicate with the accommodation chamber through the mounting hole 610. The air outlet of the air extraction device 400 and the mounting hole 610 can be sealed and connected to prevent air leakage from affecting the air extraction effect of the air extraction device 400. Thus, the mounting member 600 can cause the air extraction device 400 to easily communicate with the accommodation chamber to facilitate the installation of the above members.

Correspondingly, the air inflatable device 500 can also communicate with the accommodation chamber through the mounting hole 610. The air outlet of the air inflation device 500 and the mounting hole 610 can be sealed and connected to prevent the gas leakage from affecting the air inflation effect of the air inflation device 500. Thus, the mounting member 600 can make the air inflation device 500 easily communicate with the accommodation chamber to facilitate the installation of the above members.

If the pressure adjustment device includes the air extraction device 400 and the air inflation device 500, the air extraction device 400 and the air inflation device 500 can communicate with the accommodation chamber through two mounting holes 610, respectively.

Further, in some embodiments, the semiconductor reaction chamber of embodiments of the present disclosure further includes a connection flange 700. The connection flange 700 can be arranged on a side of the mounting member 600 away from the electrostatic chuck 200. The connection flange 700 can include an air channel 710. The air channel 710 can communicate with the mounting hole 610. The air channel 710 can be sealed and connected to the mounting hole 610. The air extraction device 400 can communicate with the air channel 710. The air outlet of the air extraction device 400 can be sealed and connected to the air channel 710. Thus, the air extraction device 400 can communicate with the accommodation chamber through the air channel 710 and the mounting hole 610 sequentially. With the connection flange 700, the installation of the functional wire can be facilitated, and the connection reliability between the air extraction device 400 and the accommodation chamber can be improved. Thus, the pressure adjustment effect can be improved in the accommodation chamber.

Similarly, the air inflation device 500 can also communicate with the gas channel 710. The air outlet of the inflation device 500 can be sealed and connected to the gas channel 710. Thus, the air inflation device 500 can communicate with the accommodation chamber through the gas channel 710 and the mounting hole 610 in sequence. With the connection flange 700, the installation of the functional wire can be facilitated, and the connection stability between the air inflation device 500 and the accommodation chamber can be improved. Thus, the pressure adjustment effect in the accommodation chamber can be further improved.

If the pressure adjustment device includes the air extraction device 400 and the air inflation device 500, two mounting holes 610 and two air channels 710 can be provided and arranged correspondingly.

In some embodiments, as shown in FIG. 2, in order to facilitate the functional wire 300 in the accommodation chamber to pass through, a wire hole 740 that communicates with the air channel 710 is formed at a sidewall of the connection flange 700. The functional wire 300 can pass through the wire hole 740. Thus, the functional wire 300 can be prevented from affecting the communication effect between the air extraction device 400 or the air inflation device 500 and the connection flange 700 when the functional wire 300 passes through the wire hole 740. In some embodiments, the functional wire 300 can be sealed and connected to the wire hole 740 to prevent the air leakage from affecting the air extraction or inflation effect.

In some embodiments, the pressure adjustment device including the air extraction device 400 and the air inflation device 500 and two accommodation chambers are taken as an example. As shown in FIG. 2, the first pipeline 420 of the air extraction device 400 and the second pipeline 520 of the air inflation device 500 communicate with each other through a connection pipeline 450. Thus, the air extraction mechanism 410 can communicate with the two air channels 710 through the first pipeline 420 and the connection pipeline 450 to extract air of the two accommodation chambers. Thus, the utilization rate of the air extraction device 400 can be improved. Similarly, the air inflation device 500 can communicate with the two air channels 710 through the second pipeline 520 and the connection pipeline 450 to inflate air to the two accommodation chambers. Thus, the utilization rate of the air inflation device 500 can be improved. In practical applications, another pipeline structure can be used to realize the communication between the air extraction device 400 and the plurality of accommodation chambers and the communication between the air inflation device 500 and the plurality of accommodation chambers.

In some embodiments, the semiconductor reaction chamber of embodiments of the present disclosure can further include a sealing ring (not shown in the figure). The sealing ring can be arranged between surfaces of the mounting member 600 and the connection flange 700 opposite to each other. The sealing ring can be arranged around the mounting hole 610. Thus, the air channel 710 and the mounting hole 610 can be sealed and connected through the sealing ring. Therefore, the sealing ring can cause the air channel 710 and the mounting hole 610 to have a good sealing effect to prevent the air from being leaked from a gap between the mounting member 600 and the connection flange 700. A quantity of sealing rings can be equal to a quantity of air channels 710 and mounting holes 610. The sealing rings can be arranged in a one-to-one correspondence with the air channels 710 and the mounting holes 610.

Further, to improve an installation effect of the sealing ring, an annular groove 620 can be formed on a side of the mounting member 600 facing the connection flange 700. The annular groove 620 can be arranged around the mounting hole 610. A part of the sealing ring can be located in the annular groove 620. Thus, the annular groove 620 can limit the position of the sealing ring to prevent the sealing ring from having an offset to affect the sealing effect between the air channel 710 and the mounting hole 610.

Figure 5:
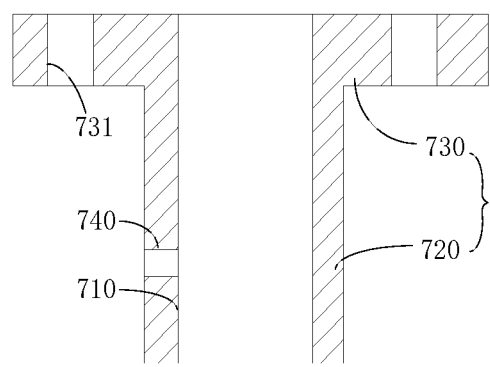
FIG. 5 illustrates a schematic cross-sectional diagram of a connection flange of a semiconductor reaction chamber according to some embodiments of the present disclosure.

The connection flange 700 and the mounting member 600 can have a plurality of connection manners, such as bonding connection, snap connection, and fastening screw connection. In some embodiments, the semiconductor reaction chamber of embodiments of the present disclosure can further include a fastener screw. The connection flange 700 can include a body member 720 and a connection member 730 connected to each other. The sealing ring can be arranged between the surfaces of the mounting member 600 and the connection member 730 that are opposite to each other. The sealing ring can be arranged around the mounting hole 610. With reference to FIG. 5, the connection member 730 includes a first via 731, and the mounting member 600 includes a threaded hole. The fastener screw can pass through the first via 731 and can be connected to the threaded hole. Compared to other connection manners, using the fastener screw, the connection reliability between the connection flange 700 and the mounting member 600 can be improved. When the sealing ring is arranged between the connection flange 700 and the mounting member 600, by fastening the fastener screw, the sealing ring can be pressed to cause the air channel 710 and the mounting hole 610 to have a good sealing effect. In some embodiments, the sealing ring can be a flexible member. Thus, the sealing effect between the air channel 710 and the mounting hole 610 can be better improved.

Figure 3:
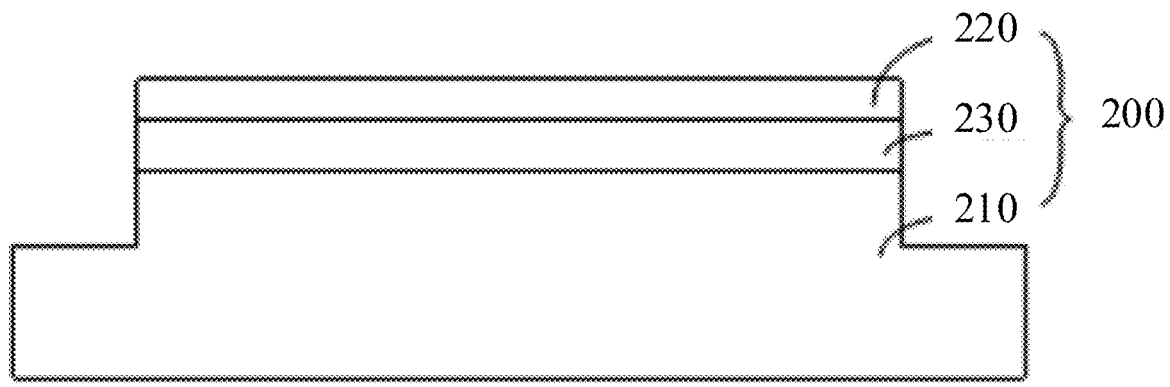
FIG. 3 illustrates a schematic structural diagram of an electrostatic chuck of a semiconductor reaction chamber according to some embodiments of the present disclosure.
Figure 4:
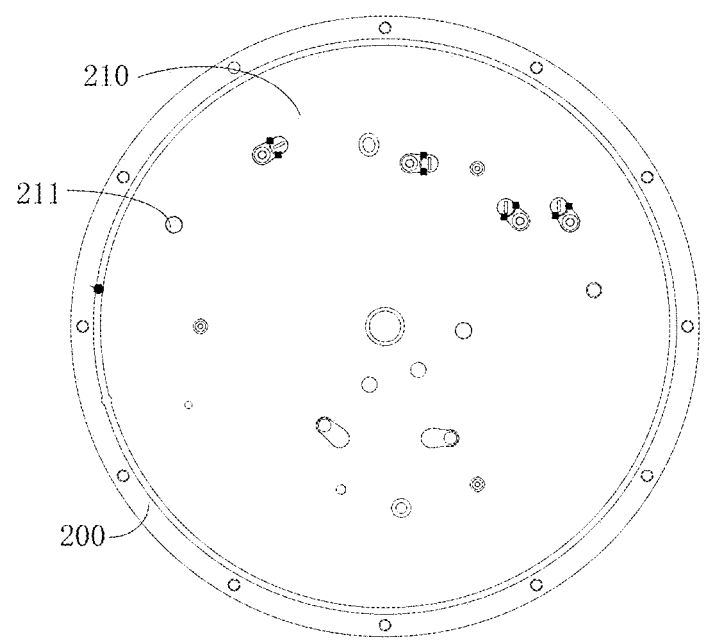
FIG. 4 illustrates a schematic structural diagram of FIG. 3 in another view angle.

In embodiments of the present disclosure, as shown in FIG. 3, the functional layer includes, for example, a ceramic layer 220 and a heating layer 230. In some embodiments, the ceramic layer 220 can be arranged over the heating layer 230. The heating layer 230 can be arranged over the base body 210. The ceramic layer 220, the heating layer 230, and the base body 210 can be fixedly connected in a bonding manner. Thus, as shown in FIG. 2 and FIG. 4, the heating layer 230 covers the end opening of the connection wire channel 211 and encloses with the base body 210 to form an accommodation chamber. The functional wire 300 can include a control wire. An end of the control wire can be connected to a first apparatus 810. Another end of the control wire can pass through the connection wire channel 211 and can be electrically connected to the heating layer 230. The first apparatus 810 can control the heating layer 230 through the above control wire to the heating layer 230 to heat the wafer arranged on the surface of the ceramic layer 220. Thus, the control wire can realize electrical conduction between the heating layer 230 and the first apparatus 810 to facilitate the first apparatus 810 to control the heating layer 230 to heat the wafer. The first apparatus 810 can include, e.g., a heating power adjustment device and a controller.

In some embodiments, when the electrostatic chuck 200 includes the ceramic layer 220, the heating layer 230, and the base body 210 connected in sequence, the connection method of the ceramic layer 220, the heating layer 230, and the base body 210 can be the same as the connection method in the above embodiment and is not be repeated. The functional wire 300 can include a detection wire. Correspondingly, the heating layer 230 can include a second via 231 that communicates with the connection wire channel 211. Thus, the second via 231 can communicate with the accommodation chamber. An end of the detection wire can be connected to a second apparatus 820. Another end of the detection wire can pass through the connection wire channel 211 and the second via 231 in sequence and can be in contact with the ceramic layer 220. Thus, the second apparatus 820 can include, for example, a temperature measurement sensor (or a temperature measurement sensor and a controller). The above detection wire can be a detection connection wire of the temperature measurement sensor. The temperature measurement sensor can be, for example, a thermocouple or a temperature measurement optical fiber. The detection connection wire of the temperature measurement sensor can pass through the accommodation chamber to measure the temperature of the wafer.

The first apparatus 810 and the second apparatus 820 of embodiments of the present disclosure can be located outside the chamber body 100. An end of the functional wire 300 can be electrically connected to the first apparatus 810 and/or the second apparatus 820. Another end of the functional wire 300 can extend into the inner chamber to further pass through into the connection wire channel 211 to further be in contact with the functional layer. If the functional wire 300 includes the detection wire, e.g., the detection wire of the temperature measurement temperature, the functional layer being in contact with the functional wire 300 can refer to that the detection wire is in contact with the ceramic layer 220 of the functional layer. If the functional wire 300 includes the control wire, the functional layer being in contact with the functional wire 300 can refer to that the control wire is electrically connected to the heating layer 230 of the functional layer. In practical applications, different types of functional wires 300 can have a connection manner with the functional layer, which can be adaptively modified. The present disclosure does not limit the connection manner.

Based on the semiconductor reaction chamber of embodiments of the present disclosure, embodiments of the present disclosure further provide a semiconductor processing apparatus. The semiconductor processing apparatus of the present disclosure can include the semiconductor reaction chamber of embodiments of the present disclosure.

The above embodiments of the present disclosure mainly describe the differences between the various embodiments. As long as different optimization features of the various embodiments are not contradictory, the optimization features can be combined to form better embodiments, which are not repeated here.

The above descriptions are merely embodiments of the present disclosure and are not intended to limit the present disclosure. Various modifications and variations of the present disclosure are possible for those skilled in the art. Any modification, equivalent replacement, improvement, etc. made within the spirit and principle of the present disclosure shall be within the scope of the claims of the present application.

What is claimed is:

1. A semiconductor reaction chamber comprising:
a chamber body including an inner chamber;
an electrostatic chuck located in the inner chamber and including:
  a base body including two connection wire channels; and
  a functional layer arranged on the base body, the base body and the functional layer being fixed by bonding, the functional layer covering an end opening of each of the two connection wire channels and forming two accommodation chambers with the base body;
a functional wire passing through each connection wire channel and being in contact with the functional layer;
a connection flange arranged under the electrostatic chuck; and
a pressure adjustment device communicating with the two accommodation chambers, being configured to balance a pressure in the two accommodation chambers and a pressure in the inner chamber by inflating or extracting gas into or out of the two accommodation chambers independently, and including:
  an air extraction device including:
    a vacuum pump or a fan, and a first pipeline; and
  an air inflation device including:
    a gas supply, and a second pipeline;
  wherein:
    the first pipeline includes a first switch valve configured to switch the gas on and off to extract gas out of each accommodation chamber;
    the second pipeline includes a second switch valve configured to switch the gas on and off to inflate the gas into each accommodation chamber, the first switch valve and the second switch valve operating independently; and
    a connection pipeline is directly connected between the first pipeline and the second pipeline, is an independent pipeline arranged outside and under the connection flange, and is configured to communicate the first pipeline with the second pipeline such that the air extraction device and the air inflation device each communicate with one of the two accommodation chambers via the connection pipeline.

2. The semiconductor reaction chamber according to claim 1, wherein:
the air extraction device communicates with the two accommodation chambers and is configured to vacuum each accommodation chamber;
the air inflation device communicates with the two accommodation chambers and is configured to inflate each accommodation chamber;
the air extraction device is arranged outside of the inner chamber and the air extraction device communicates with the accommodation chamber through the first pipeline; and the air inflation device is arranged outside of the inner chamber and the air inflation device communicates with the accommodation chamber through the second pipeline.

3. The semiconductor reaction chamber according to claim 1, further comprising a pressure detector configured to detect the pressure in the two accommodation chambers.

4. The semiconductor reaction chamber according to claim 1, further comprising:
a lower electrode shell body; and
a mounting member located in the lower electrode shell body, the base body being arranged on the mounting member, the mounting member including two mounting holes each communicating with a corresponding accommodation chamber, and the air extraction device and the air inflation device communicate with the two accommodation chambers through the two mounting holes.

5. The semiconductor reaction chamber according to claim 4, wherein:
the connection flange is arranged on a side of the mounting member away from the electrostatic chuck, the connection flange includes two air channels, each air channel communicates with a corresponding mounting hole, and the air extraction device and/or the air inflation device communicate with the two air channels.

6. The semiconductor reaction chamber according to claim 5, further comprising:
two sealing rings arranged between surfaces of the mounting member and the connection flange opposite to each other, each sealing ring arranged around a corresponding mounting hole and configured to seal connection between a respective air channel and a respective mounting hole.

7. The semiconductor reaction chamber according to claim 6, further comprising:
a fastener screw, wherein:
the connection flange includes:
  a body member; and
  a connection member connected to the body member and including a first via, the mounting member including a threaded hole; and
the fastener screw passes through the first via and cooperates with the threaded hole.

8. The semiconductor reaction chamber according to claim 1, wherein:
two wire holes are formed on a sidewall of the connection flange and each wire hole communicates with a corresponding air channel;
the functional wire includes:
  a control wire connected to a heating power adjustment device and a controller to control the functional layer to heat a wafer; and
  a detection wire connected to a temperature measurement sensor to detect a temperature of the wafer;
a first sealing structure is arranged between the control wire and a first wire hole of the two wire holes and configured to seal a gap between the control wire and the first wire hole; and
a second sealing structure is arranged between the detection wire and a second wire hole of the two wire holes and configured to seal a gap between the detection wire and the second wire hole.

9. The semiconductor reaction chamber of claim 1, wherein the functional layer includes:
a heating layer arranged on the base body, the heating layer covering the end opening of each of the two connection wire channels, and including a second via communicating with one of the two connection wire channels; and a ceramic layer arranged on the heating layer and the second via;

wherein the functional wire includes:

a control wire being electrically connected to the heating layer and a detection wire in contact with the ceramic layer through the second via.

10. A semiconductor processing apparatus comprising a semiconductor reaction chamber including:

a chamber body including an inner chamber;

an electrostatic chuck located in the inner chamber and including:

a base body including two connection wire channels; and a functional layer arranged on the base body, the base body and the functional layer being fixed by bonding, the functional layer covering an end opening of each of the two connection wire channels and forming two accommodation chambers with the base body;

a functional wire passing through each connection wire channel and being in contact with the functional layer;

a connection flange arranged under the electrostatic chuck; and a pressure adjustment device communicating with the two accommodation chambers and being configured to balance a pressure in the two accommodation chambers and a pressure in the inner chamber by inflating or extracting gas into or out of the two accommodation chambers independently, and including:

an air extraction device including:

a vacuum pump or a fan, and a first pipeline; and an air inflation device including:

a gas supply, and a second pipeline;

wherein:

the first pipeline includes a first switch valve configured to switch the gas on and off to extract gas out of each accommodation chamber;

the second pipeline includes a second switch valve configured to switch the gas on and off to inflate the gas into each accommodation chamber, the first switch valve and the second switch valve operating independently; and a connection pipeline is directly connected between the first pipeline and the second pipeline, is an independent pipeline arranged outside and under the connection flange, and is configured to communicate the first pipeline with the second pipeline such that the air extraction device and the air inflation device each communicate with one of the two accommodation chambers via the connection pipeline.

11. The semiconductor processing apparatus according to claim 10, wherein:

the air extraction device communicates with the two accommodation chambers and is configured to vacuum each accommodation chamber;

the air inflation device communicates with the two accommodation chambers and is configured to inflate each accommodation chamber;

the air extraction device is arranged outside of the inner chamber and the air extraction device communicates with the accommodation chamber through the first pipeline; and the air inflation device is arranged outside of the inner chamber and the air inflation device communicates with the accommodation chamber through the second pipeline.

12. The semiconductor processing apparatus according to claim 10, further comprising a pressure detector configured to detect the pressure in the two accommodation chambers.

13. The semiconductor processing apparatus according to claim 10, further comprising:

a lower electrode shell body; and a mounting member located in the lower electrode shell body, the base body being arranged on the mounting member, the mounting member including two mounting holes each communicating with a corresponding accommodation chamber, and the air extraction device and/or the air inflation device communicate with the two accommodation chambers through the two mounting holes.

14. The semiconductor processing apparatus according to claim 13, wherein:

the connection flange is arranged on a side of the mounting member away from the electrostatic chuck, the connection flange includes two air channels, each air channel communicates with a corresponding mounting hole, and the air extraction device and the air inflation device communicates with the two air channels.

15. The semiconductor processing apparatus according to claim 14, further comprising:

two sealing rings arranged between surfaces of the mounting member and the connection flange opposite to each other, each sealing ring arranged around a corresponding mounting hole and configured to seal connection between a respective air channel and a respective the mounting hole.

16. The semiconductor processing apparatus according to claim 15, further comprising:

a fastener screw, wherein:

the connection flange includes:

a body member; and a connection member connected to the body member and including a first via, the mounting member including a threaded hole; and the fastener screw passes through the first via and cooperates with the threaded hole.

17. The semiconductor processing apparatus according to claim 10, wherein:

two wire holes are formed on a sidewall of the connection flange and each wire hole communicates with a corresponding air channel;

the functional wire includes:

a control wire connected to a heating power adjustment device and a controller to control the functional layer to heat a wafer; and a detection wire connected to a temperature measurement sensor to detect a temperature of the wafer;

a first sealing structure is arranged between the control wire and a first wire hole of the two wire holes and configured to seal a gap between the control wire and the first wire hole; and a second sealing structure is arranged between the detection wire and a second wire hole of the two wire holes and configured to seal a gap between the detection wire and the second wire hole.

18. The semiconductor processing apparatus of claim 10, wherein the functional layer includes:

a heating layer arranged on the base body, the heating layer covering the end opening of each of the two connection wire channels and including a second via communicating with one of the two connection wire channels; and a ceramic layer arranged on the heating layer and the second via;

wherein the functional wire includes:
   a control wire being electrically connected to the heating layer and a detection wire in contact with the ceramic layer through the second via.

\* \* \* \* \*